(12) United States Patent
Lin et al.

(10) Patent No.: US 11,057,112 B1
(45) Date of Patent: Jul. 6, 2021

(54) MONITOR PHOTODIODE (MPD) SUBMOUNT FOR VERTICAL MOUNTING AND ALIGNMENT OF MONITORING PHOTODIODES

(71) Applicant: Applied Optoelectronics, Inc., Sugar Land, TX (US)

(72) Inventors: Kai-Sheng Lin, Sugar Land, TX (US); Hao-Chiang Cheng, Houston, TX (US); Hang Xie, Missouri City, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 0 days.

(21) Appl. No.: 16/737,414

(22) Filed: Jan. 8, 2020

(51) Int. Cl.
*H04B 10/00* (2013.01)
*H04B 10/40* (2013.01)
*H04B 10/50* (2013.01)
*H04B 10/67* (2013.01)
*G02B 6/42* (2006.01)
*H01S 5/026* (2006.01)
*H04B 10/69* (2013.01)

(52) U.S. Cl.
CPC ............. *H04B 10/40* (2013.01); *G02B 6/428* (2013.01); *G02B 6/4215* (2013.01); *G02B 6/4245* (2013.01); *G02B 6/4256* (2013.01); *H01S 5/0264* (2013.01); *H04B 10/503* (2013.01); *H04B 10/506* (2013.01); *H04B 10/67* (2013.01); *H04B 10/69* (2013.01)

(58) Field of Classification Search
CPC combination set(s) only.
See application file for complete search history.

(56) References Cited

U.S. PATENT DOCUMENTS 5,347,604 A * 9/1994 Go .................... G02B 6/4201
 385/92
5,606,182 A * 2/1997 Yoshida ............ G02B 6/4204
 257/431

(Continued)

OTHER PUBLICATIONS

U.S. Office Action dated Oct. 5, 2020, in U.S. Appl. No. 16/737,438, 14 pgs.

*Primary Examiner* — Agustin Bello
(74) *Attorney, Agent, or Firm* — Grossman Tucker Perreault & Pfleger, PLLC; Norman S. Kinsella (57) ABSTRACT

The present disclosure is generally directed to a monitor photodiode (MPD) submount for use in optical transceivers that includes a body with a conductive trace pattern disposed on multiple surfaces of the same to allow for vertical mounting of an associated MPD and simplified electrical interconnection with TOSA circuitry without the necessity of electrical interconnection. The MPD submount includes a body defined by a plurality of sidewalls. At least one surface of the body provides a mounting surface for coupling to and supporting an MPD. The MPD submount further includes a conductive trace pattern that provides at least one conductive path that is disposed on the mounting surface and on at least one adjoining sidewall. The portion of the at least one conductive path disposed on the adjoining sidewall extends substantially transverse relative to the surface defining the transceiver/transmitter substrate when the MPD submount is coupled to the same.

16 Claims, 5 Drawing Sheets

(56) References Cited

U.S. PATENT DOCUMENTS

| | | | | |
|---|---|---|---|---|
| 5,699,377 A * | 12/1997 | Pan | G02B 6/0218 | 372/102 |
| 9,548,817 B1 * | 1/2017 | Nagarajan | H01S 5/068 | |
| 9,553,671 B1 * | 1/2017 | Nagarajan | H04B 10/40 | |
| 2002/0118715 A1 * | 8/2002 | Kimura | H01S 5/147 | 372/36 |
| 2002/0167017 A1 * | 11/2002 | Nakabayashi | G02B 6/4201 | 257/98 |
| 2003/0053169 A1 * | 3/2003 | Nasu | H04B 10/572 | 398/91 |
| 2003/0174976 A1 * | 9/2003 | Fukuda | G02B 6/4201 | 385/93 |
| 2003/0206703 A1 * | 11/2003 | Chiu | G02B 6/4208 | 385/93 |
| 2004/0240803 A1 * | 12/2004 | Rechberger | G02B 6/4201 | 385/93 |
| 2006/0029337 A1 * | 2/2006 | Vancoille | H01S 5/02208 | 385/94 |
| 2006/0043609 A1 | 3/2006 | Brennan et al. | | |
| 2006/0159404 A1 * | 7/2006 | Vancoille | G02B 6/4214 | 385/88 |
| 2007/0071444 A1 * | 3/2007 | Okada | G02B 6/4215 | 398/135 |
| 2009/0269077 A1 * | 10/2009 | Sone | H04B 10/40 | 398/135 |
| 2010/0178061 A1 * | 7/2010 | Tawa | H04B 10/40 | 398/139 |
| 2011/0217045 A1 * | 9/2011 | Watson | G02B 6/42 | 398/79 |
| 2012/0267777 A1 | 10/2012 | Haba et al. | | |
| 2013/0051024 A1 * | 2/2013 | Amit | H04B 10/40 | 362/259 |
| 2014/0105612 A1 | 4/2014 | Wu et al. | | |
| 2014/0215816 A1 * | 8/2014 | Kurokawa | G02B 6/4225 | 29/832 |
| 2015/0104179 A1 * | 4/2015 | Wang | H04J 14/0282 | 398/81 |
| 2016/0334592 A1 * | 11/2016 | McColloch | H04B 10/40 | |
| 2017/0168252 A1 * | 6/2017 | Pezeshki | G02B 6/428 | |
| 2018/0131442 A1 * | 5/2018 | Ho | G02B 6/4263 | |
| 2018/0172928 A1 * | 6/2018 | Ho | G02B 6/4281 | |
| 2018/0284370 A1 * | 10/2018 | Ho | G02B 6/4237 | |
| 2018/0348453 A1 * | 12/2018 | Lee | G02B 6/421 | |
| 2020/0271875 A1 * | 8/2020 | Benoliel | G02B 6/4243 | |
| 2020/0373737 A1 * | 11/2020 | Lin | H01S 5/06837 | |

* cited by examiner

MONITOR PHOTODIODE (MPD) SUBMOUNT FOR VERTICAL MOUNTING AND ALIGNMENT OF MONITORING PHOTODIODES

CROSS-REFERENCE TO RELATED APPLICATIONS

The present application is related to co-pending application Ser. No. 16/737,438 entitled "Substrate with Stepped Profile for Mounting Transmitter Optical Subassemblies and an Optical Transmitter or Transceiver Implementing Same" filed concurrently herewith on Jan. 8, 2020, the disclosure of which is incorporated herein by reference in its entirety.

TECHNICAL FIELD

The present disclosure relates to optical communication devices, and more particularly, to a MPD submount with a trace pattern/metallization disposed on multiple surfaces of the same to support vertical mounting of a MPD and simplified mounting, optical alignment and electrical coupling with an associated transmitter/transceiver substrate.

BACKGROUND

Optical transceivers are used to transmit and receive optical signals for various application including, without limitation, internet data center, cable TV broadband, and fiber to the home (FTTH) applications. Optical transceivers provide higher speeds and bandwidth over longer distances, for example, as compared to transmission over copper cables. The desire to provide higher speeds in smaller optical transceiver modules has presented challenges, for example, with respect to space management and manufacturing yield.

Optical transceiver modules generally include one or more transmitter optical subassemblies (TOSAs) for transmitting optical signals and one or more receiver optical subassemblies (ROSAs) for receiving optical signals. In general, TOSAs include one or more lasers to emit one or more channel wavelengths and associated circuitry for driving the lasers and monitoring power to ensure nominal performance. Optical power monitoring in TOSAs can include disposing an MPD adjacent an associated laser diode to receive a portion of light, e.g., 1%, and measure optical power. However, continued scaling and increased channel density presents numerous technical challenges that complicates MPD placement, orientation, and electrical interconnection.

BRIEF DESCRIPTION OF THE DRAWINGS

These and other features and advantages will be better understood by reading the following detailed description, taken together with the drawings wherein.

DETAILED DESCRIPTION

As discussed above, optical modules continue to scale and complicate design of MPD arrangements to ensure nominal power in TOSA modules. Space constraints, thermal management, and trace routing significantly complicates placement of MPDs. Some approaches dispose MDPs, and in particular MPD submounts such as PCBs, directly on electrically conductive traces of a transmitter/transceiver substrate, with the electrically conductive traces being generally aligned with laser diodes to allow MPDs to receive a small percentage of light, e.g., 1%. In this configuration, an MPD can thus be mounted external to an associated TOSA module to reduce overall TOSA dimensions, and conversely, the complexity of mounting MPDs within space-constrained TOSAs. This configuration can include the MPD "vertically" mounted via the MPD submount to ensure a photo-sensitive region of the same receives light from a laser diode.

However, mounting MPDs in this manner raises numerous non-trivial challenges and considerations. By way of example, consider an edge MPD vertically mounted to a transceiver/transmitter substrate via a submount. In this scenario, proper trace layouts/routing for the MPD ensures that an associated cathode has a higher voltage than the anode, and that the voltage difference therebetween is also is greater than the threshold voltage of the MPD. However, in this scenario the anode (V−) of the edge MPD gets electrically coupled by virtue of the MPD submount mounting, e.g., directly, to conductive ground traces of the transceiver/transmitter substrate (See e.g., FIGS. 2 & 3). Supplying a negative voltage to operate the MPD thus necessitates additional circuitry, which can become impractical and complex when many transceivers/transmitters get supplied positive voltages. In short, these challenges are simply not overcome by providing a positive, stepped down voltage to the MPD.

In contrast, surface MPDs are generally smaller and less expensive than an equivalent edge PD. However, vertical mounting of surface MPDs via an MPD submount requires wire bonds or other electrical interconnects to electrically couple the cathode and anode of the MPD to ground and RF traces/pads of the transceiver/transmitter PCB, respectively. Such wire bonds introduce additional complexity, such as an additional heating step for the electrical pads, and also introduce points of failure as wire bonding can be easily damaged during manufacturing.

Thus, the present disclosure is generally directed to a monitor photodiode (MPD) submount for use in optical transceivers/transmitters that includes a body with a conductive trace pattern disposed on multiple sides/surfaces of the same to allow for vertical mounting of an associated MPD and simplified (e.g., direct) electrical interconnection with TOSA circuitry without the necessity of electrical interconnection, such as wire bonds.

In particular, an MPD submount consistent with the present disclosure includes a body defined by a plurality of sidewalls. At least one surface of the body provides a mounting surface for coupling to and supporting an MPD. The MPD submount further includes a conductive trace pattern that provides at least one conductive path that is disposed on the mounting surface and on at least one adjoining sidewall. Preferably, the at least one conductive path is disposed on a sidewall of the MPD submount that extends substantially transverse relative to the surface defining the transceiver/transmitter substrate when the MPD submount is coupled to the same.

Likewise, the at least one conductive path includes at least a portion that is disposed at, or adjacent to, an interface formed between the MPD submount and the surface of the transceiver/transmitter substrate. A electrically conductive epoxy, e.g., silver epoxy, may therefore be disposed along the interface between the body of the MPD submount and transceiver/transmitter substrate to electrically couple the at least one conductive path to a pad/trace of the transceiver/transmitter substrate. The electrically conductive epoxy may be generally referred to herein as simply conductive epoxy, or simply conductive material. Note that a non-conductive epoxy may also be utilized and is within the scope of this disclosure.

In any event, two or more conductive paths provided by the trace pattern of the MPD can allow for both the anode and cathode of the MPD to couple to ground and RF pads, respectively, via deposition of an electrically conductive epoxy. The present disclosure has also identified that the body of the MPD submount can include a profile/shape with contours, e.g., channels/chamfers, that facilitate flow and adhesion of epoxy around an interface between the MPD submount and associated transceiver/transmitter substrate, as is discussed in greater detail below.

An MPD submount consistent with the present disclosure thus provides numerous advantages over other approaches. For example, wire bonding can be reduced and/or eliminated to reduce manufacturing complexity and increase yield. In addition, the present disclosure simplifies mounting (also known as bonding) and electrical coupling of MPDs to an associated transceiver/transmitter substrate via conductive epoxy deposition processes, which avoids the necessity of additional heating stages during manufacture. Channels/contours of the MPD submount can further encourage epoxy flow while also reducing the overall footprint of the MPD submount. Moreover, minor adjustment to MPD orientation, e.g., relative to an associated laser diode, can be achieved while epoxy cures, thus allowing for greater tolerances and multiple manufacturing phases to occur at substantially the same time.

Note, while the present disclosure illustrates and discusses surface MPDs, this disclosure is not limited in this regard. The present disclosure is equally applicable to other MPD devices including, for example, edge MPDs. Likewise, the present disclosure illustrates and describes a multi-channel optical transceiver module utilizing MPD submounts consistent with the present disclosure. However, the present disclosure is equally applicable to other types of optical subassemblies such as single channel and multi-channel optical transmitters.

As used herein, "channel wavelengths" refer to the wavelengths associated with optical channels and may include a specified wavelength band around a center wavelength. In one example, the channel wavelengths may be defined by an International Telecommunication (ITU) standard such as the ITU-T dense wavelength division multiplexing (DWDM) grid. This disclosure is equally applicable to coarse wavelength division multiplexing (CWDM). In one specific example embodiment, the channel wavelengths are implemented in accordance with local area network (LAN) wavelength division multiplexing (WDM), which may also be referred to as LWDM. The term "coupled" as used herein refers to any connection, coupling, link or the like and "optically coupled" refers to coupling such that light from one element is imparted to another element. Such "coupled" devices are not necessarily directly connected to one another and may be separated by intermediate components or devices that may manipulate or modify such signals.

The term substantially, as generally referred to herein, refers to a degree of precision within acceptable tolerance that accounts for and reflects minor real-world variation due to material composition, material defects, and/or limitations/peculiarities in manufacturing processes. Such variation may therefore be said to achieve largely, but not necessarily wholly, the stated characteristic. To provide one non-limiting numerical example to quantify "substantially," minor variation may cause a deviation of up to and including ±5% from a particular stated quality/characteristic unless otherwise provided by the present disclosure.

Figure 1:
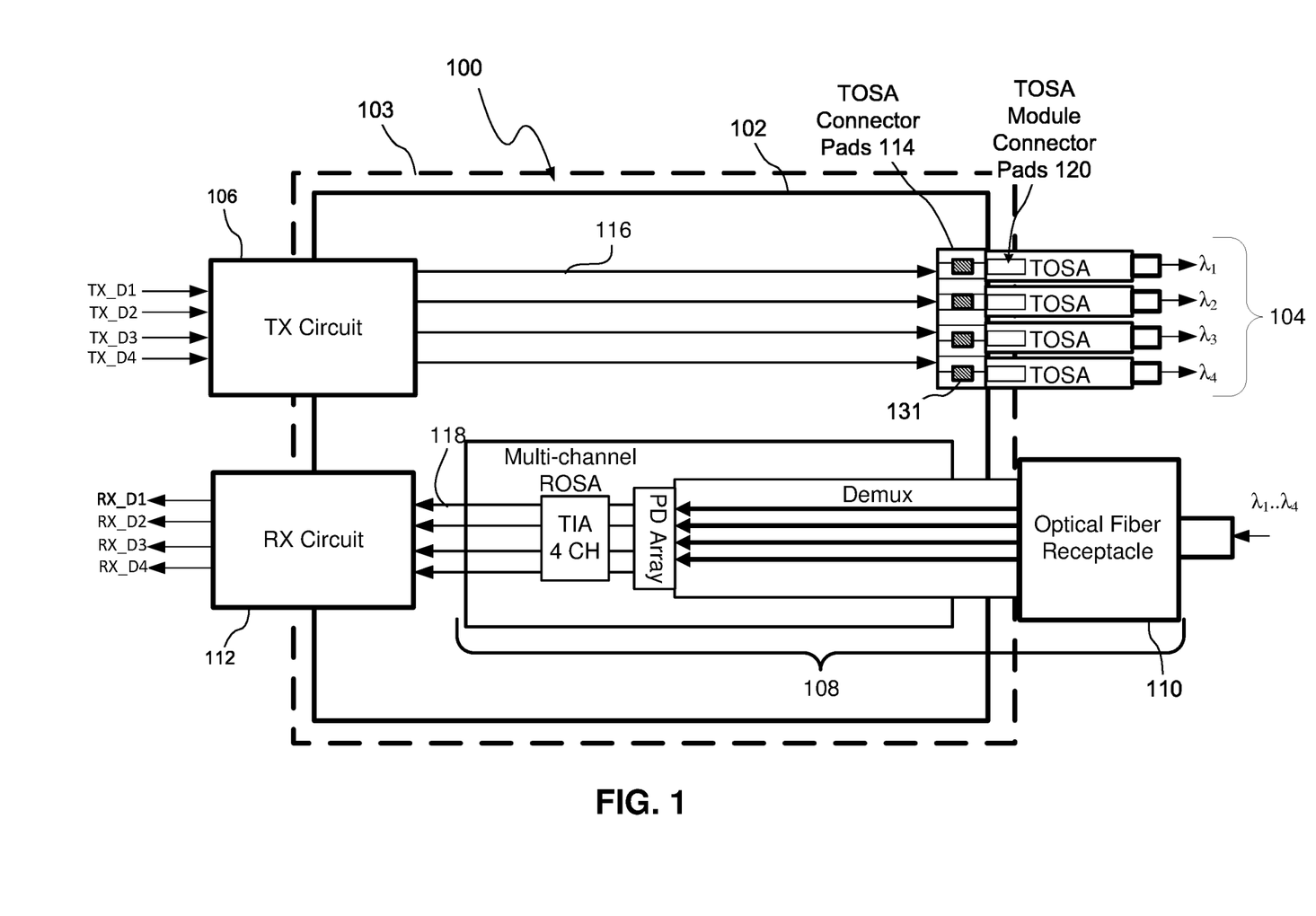
FIG. 1 shows a block diagram of an example multi-channel optical transceiver module in accordance with an embodiment of the present disclosure.

Referring to the Figures, FIG. 1 illustrates an optical transceiver module 100, consistent with embodiments of the present disclosure. The optical transceiver module 100 is shown in a highly simplified form for clarity and ease of explanation and not for purposes of limitation. In this embodiment, the optical transceiver module 100 can be pluggable (e.g., comports with pluggable small form factor (SFFP) standards) and transmits and receives four (4) channels using four different channel wavelengths ($\lambda 1$, $\lambda 2$, $\lambda 3$, $\lambda 4$) and may be capable of transmission rates of at least about 25 Gbps per channel. In one example, the channel wavelengths $\lambda 1$, $\lambda 2$, $\lambda 3$, $\lambda 4$ may be within a ±13 nm range and have respective channel wavelengths of 1270 nm, 1290 nm, 1310 nm, and 1330 nm, respectively. Other channel wavelengths and configurations are within the scope of this disclosure including those associated with local area network (LAN) wavelength division multiplexing (WDM). For instance, the optical transceiver module 100 can include up to eight (8) or more channels and provide transmission rates of at least 25 Gbps per channel.

The optical transceiver module 100 may also be capable of transmission distances of 2 km to at least about 10 km. The optical transceiver module 100 may be used, for example, in internet data center applications or fiber to the home (FTTH) applications.

In an embodiment, the optical transceiver module 100 is disposed in a transceiver housing 103. The transceiver housing 103 can be configured with one or more cavities to receive one or more optical transceiver modules, depending on a desired configuration.

The optical transceiver module 100 may include a number of components to support transceiver operations. The optical transceiver module 100 may include an optical transceiver substrate 102, a plurality of transmitter optical subassemblies (TOSA) modules 104 for transmitting optical signals having different channel wavelengths, transmit connecting circuit 106, a multi-channel receiver optical subassembly (ROSA) arrangement 108 for receiving optical signals on different channel wavelengths, an optical fiber receptacle 110 to receive and align a fiber connector (e.g., a ferrule) with the ROSA, and a receiver connecting circuit 112.

The optical transceiver substrate 102 includes traces, connector pads, and other circuitry to support transceiver operations. The optical transceiver substrate 102 may include TOSA connector pads 114 (or terminals 114) that enable each of the TOSA modules 104 to mount and electrically couple to the optical transceiver substrate 102. The TOSA connector pads 114 may also be referred to herein as a simply connector pads. The optical transceiver substrate 102 may include traces 116 that couple the TOSA connector pads 114 to the transmit connecting circuit 106. As discussed in greater detail below, monitor photodiode (PD) submounts/modules may be disposed on (e.g., directly) the traces 116 and/or the TOSA connector pads 114.

The optical transceiver substrate 102 may include traces 118 that electrically couple the ROSA arrangement 108 to the receiver connecting circuit 112. The optical transceiver substrate 102 may provide an optical transceiver module that may be "plugged" into an optical transceiver cage. Therefore, the transmit connecting circuit 106 and the receiver connecting circuit 112 may electrically couple to external circuitry of the optical transceiver cage. The optical transceiver substrate 102 may be manufactured from a multi-layer printed circuitry board (PCB), although other types of substrates may be utilized and are within the scope of this disclosure.

Each of the TOSA modules 104 may be configured to receive driving electrical signals (TX_D1 to TX_D4), convert the electrical signals to a multiplexed optical signal (e.g., a signal with channel wavelengths λ1 . . . λn) and output the same to a multiplexer (not shown). Each of the TOSA modules 104 may be electrically coupled to the TOSA connector pads 114 and to the traces 116 through TOSA module connector pads 120. Each of the TOSA modules 104 may include a laser diode device and supporting circuitry. The laser diode devices of the TOSA modules 104 may include distributed feedback lasers (DFBs), Vertical External-cavity Surface-emitting lasers (VECSEL) or other suitable laser devices. In an embodiment, monitor photodiodes 131 may be used to monitor the lasers' output power, as discussed below.

Figure 2:
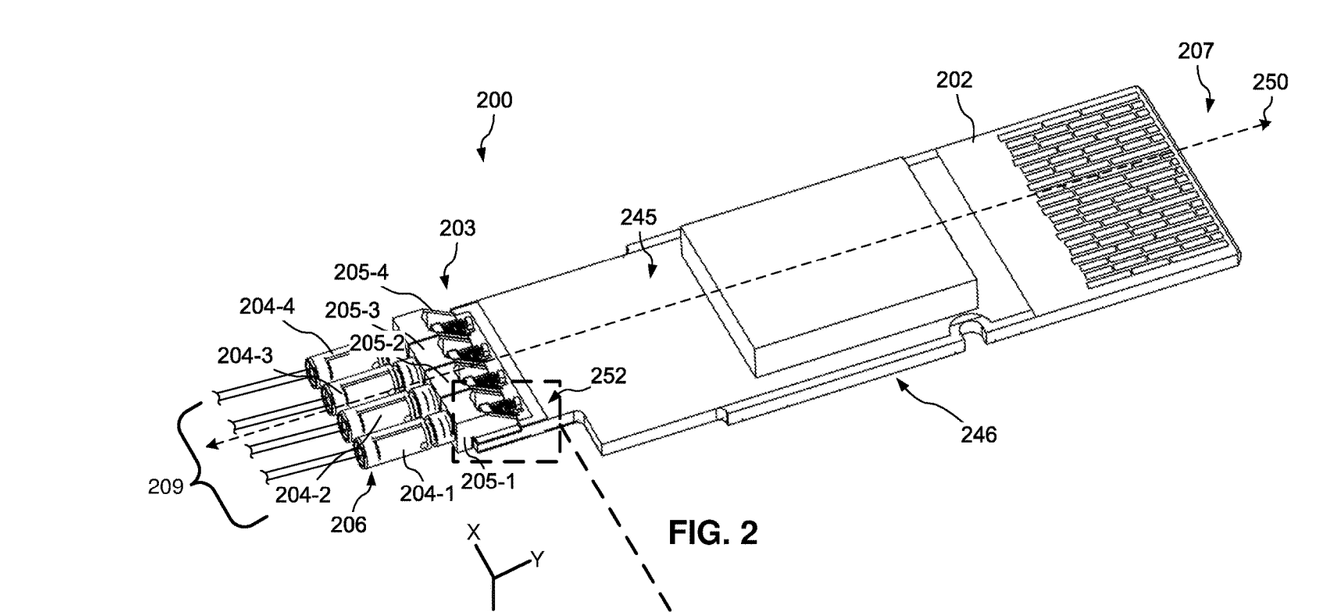
FIG. 2 is a perspective view of a multi-channel optical transceiver module for use in the multi-channel optical transceiver of FIG. 1, in accordance with an embodiment of the present disclosure.

Referring to FIG. 2, an example embodiment of a multi-channel optical transceiver module for use in the multi-channel optical transceiver of FIG. 1 is shown. As shown, the multi-channel optical transceiver module 200 includes an optical transceiver substrate 202 coupled to a TOSA arrangement 206. The optical transceiver substrate 202 may be manufactured from a multi-layer printed circuitry board, although other types of substrates may be utilized and are within the scope of this disclosure. The optical transceiver substrate 202 includes a first end 203 that extends to a second end 207 along a longitudinal axis 250. The transceiver substrate 202 further includes at least a first mounting surface 245 disposed opposite a second mounting surface 246 for supporting passive and/or active optical components. Although not shown in the embodiment of FIG. 2, the optical transceiver substrate 202 can include a multi-channel ROSA arrangement mounted to and supported by the first and/or second mounting surfaces 245, 246.

Continuing on, the TOSA arrangement 206 includes a plurality of TOSA modules 205-1 to 205-4. Each TOSA module of the plurality of TOSA modules 205-1 to 205-4 includes a base/body portion, and in the particular embodiment illustrated in FIG. 2, cuboid-type base portions. The plurality of TOSA modules 205-1 to 205-4 each support and align an associated laser arrangement with optical coupling ports 204-1 to 204-4, respectively. Thus, channel wavelengths generated by the laser arrangements get launched on to associated optical fibers 209 by way of optical coupling receptacles 204-1 to 204-5. Each laser arrangement may be configured to emit a different channel wavelength and can be monitored by an associated MPD module of an array of MPD modules to ensure nominal optical power, as will be discussed in greater detail below.

Continuing on, each of the plurality of TOSA modules 205-1 to 205-4 mount, e.g., edge mount, to the first end 203 of the substrate. The transceiver substrate 202 may further include a step/shoulder 211 proximate the first end 203. Each of the TOSA modules 205-1 to 205-4 can include a base with a plurality of sidewalls that define a generally L-shaped profile that corresponds with the step 211. The profile of the base may therefore advantageously align along at least two axis, e.g., the X and Z axis, by simply engaging/bottoming out against surfaces of the step 211 that operate as mechanical stops/limits. Alignment along the remaining axis, e.g., the Y axis, may therefore be performed by relatively simply lateral movement (e.g., along the X axis) of each TOSA module 205-1 to 205-4.

Figure 3:
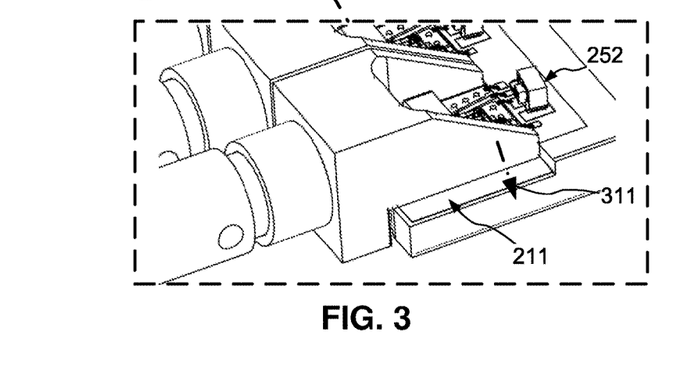
FIG. 3 shows an enlarged region of the multi-channel optical transceiver module of FIG. 2 in accordance with an embodiment of the present disclosure.
Figure 4:
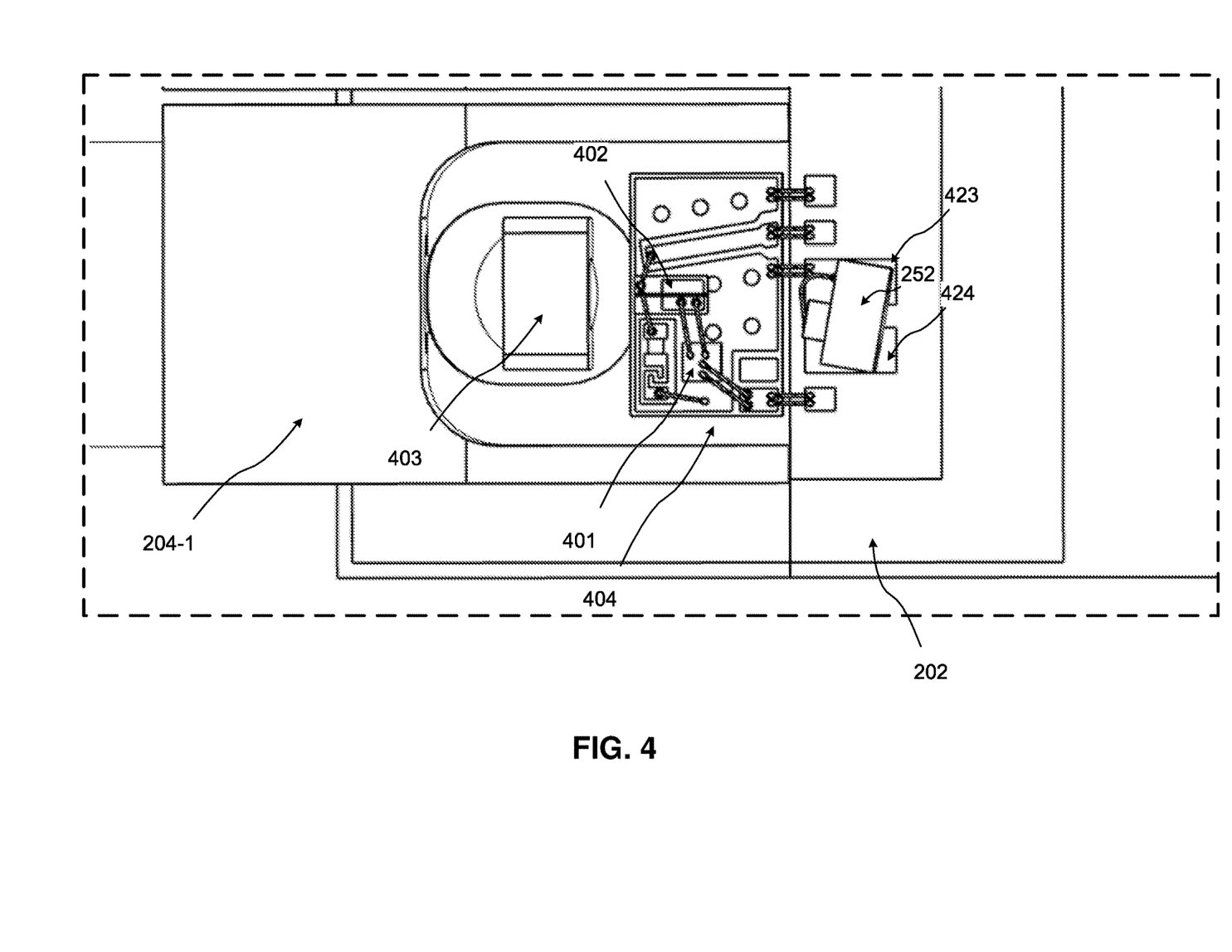
FIG. 4 shows a top view of the enlarged portion shown in FIG. 3, in accordance with an embodiment of the present disclosure.

Once aligned, each of the plurality of TOSA modules electrically couple to the transceiver substrate 202, and more particularly TOSA module connector pads disposed proximate the first end 203 of the transceiver substrate 202, which is shown more clearly in FIGS. 3 and 4. The TOSA module connector pads allow each of the TOSA modules 204-1 to 204-5 to receive driving signals and power from transmit connecting circuitry, e.g., via traces 116 and TX connecting circuit 106 (See FIG. 1).

Referring to FIGS. 3-4, an enlarged region of the multi-channel optical transceiver module of FIG. 2 is shown in accordance with embodiments of the present disclosure. As shown, each TOSA module of the TOSA arrangement 206 includes a laser arrangement having, for example, filtering capacitor 401, laser diode (LD) 402, and focusing lens 403. The LD 402 can directly mount to the body of the associated TOSA module, or indirectly via an LD submount 404, such as shown. The LD submount 404 can support components of each laser arrangement and provide electrical traces and other circuitry to support TOSA operations.

The LD 402 can be implemented as a distributed feedback lasers (DFBs), Vertical External-cavity Surface-emitting lasers (VECSEL) or other suitable laser devices. Preferably, the LD 402 is implemented as an electro-absorption modulator laser (EML). In an embodiment, the LD 402 can be uncooled (e.g., operate without an associated thermoelectric cooler). Instead, the LD 402 is in thermal communication with the body of the TOSA module to dissipate heat. In addition, the body of the TOSA module may also be in thermal communication with the transceiver substrate 202 via the step 211 to further increase heat dissipation. Accordingly, in an embodiment each TOSA module can provide a thermal communication path 311 that extends between each LD and the transceiver substrate 202 by way of an associated LD submount, TOSA body, and the step 211 of the transceiver substrate 202.

Figure 5:
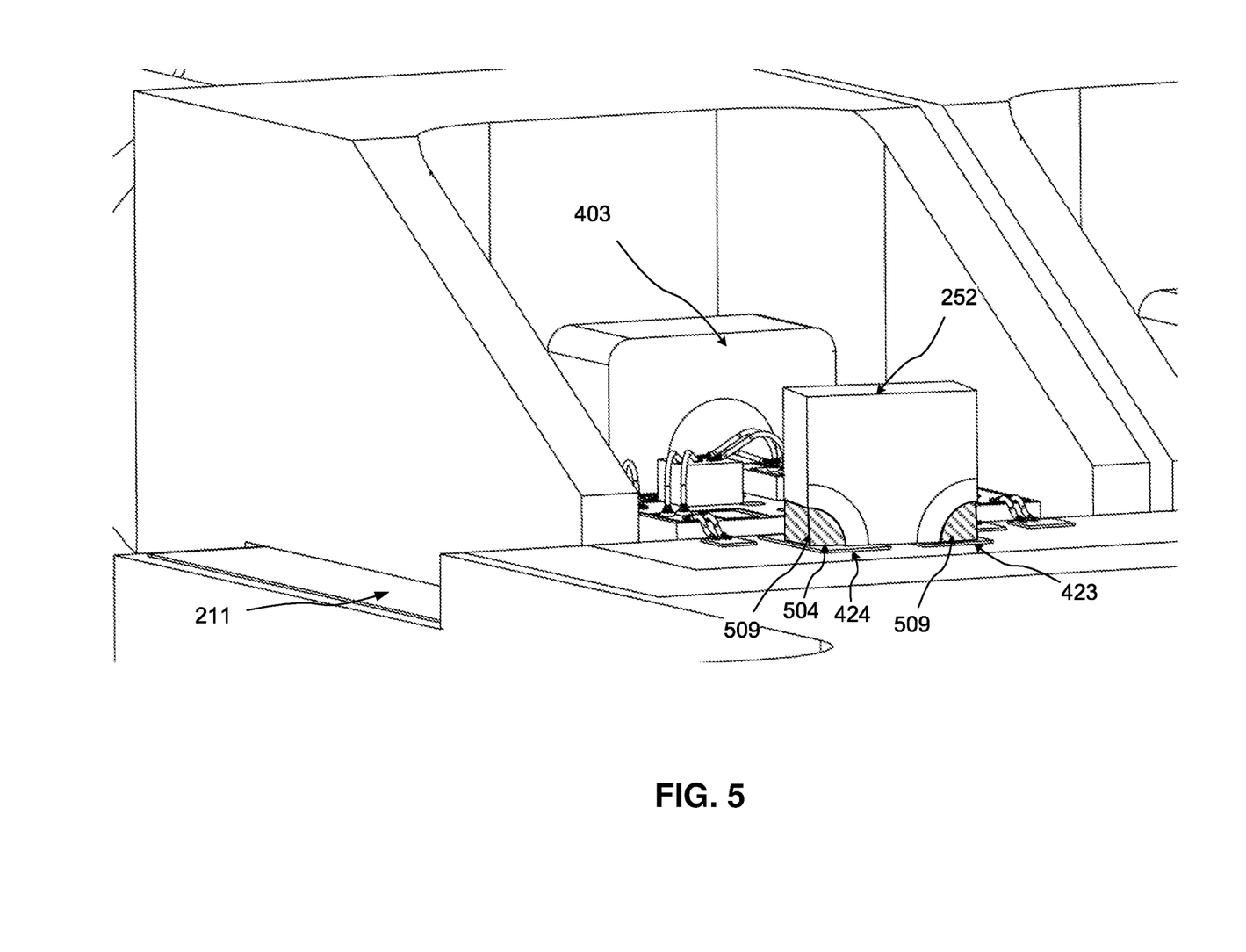
FIG. 5 shows another enlarged region of the multi-channel optical transceiver module of FIG. 2 in accordance with an embodiment of the present disclosure.

Continuing with reference to FIGS. 3-5, the components of each laser arrangement may be disposed coaxially, or substantially coaxially and be aligned with a longitudinal center line of a corresponding optical coupling receptacle (See FIG. 2). Each TOSA module of the TOSA arrangement 206 may therefore also be referred to as cuboid-type coaxial TOSA assemblies, or simply coaxial TOSA assemblies. Notably, cuboid-type TOSA bases allow for each laser assembly to be mounted in close proximity with adjacent cuboid-type TOSAs, e.g., directly contacting each other in a side-by-side relationship. Alternatively, spacing between the cuboid-type TOSA bases can provide for thermal isolation between adjacent TOSA modules (e.g., based on an air gap) while ensuring a relatively small overall footprint for the TOSA arrangement 206.

In operation, each TOSA module 205-1 to 205-4 of the TOSA arrangement 206 can emit associated channel wavelengths and launch the same along optical fibers 209, for example. Associated MPDs monitor and ensure nominal power for each of the TOSA modules 205-1, 205-4. As discussed above, each of the TOSA modules includes at least a LD, e.g., LD 402, and at least one corresponding monitor photodiode (MPD), e.g., provided by MPD module 252, to monitor the optical output power. As shown in FIG. 3, for example, the MPD module 252 optically aligns with a back surface of the LD 402 to receive and measure a small percentage of light emitted therefrom, e.g., 1-3%. Laser threshold current and slope efficiency are both functions of temperature and aging time. To maintain nominal optical output power, the electrical bias current and modulation current applied to the laser may be varied to compensate the change brought about by the variations in temperature and/or aging time. The optical transceiver module 200 can vary the current applied to the LD 402 based on the measured light to, for instance, maintain a stable output power based on an average output current of the MPD module 252.

Figure 6A:
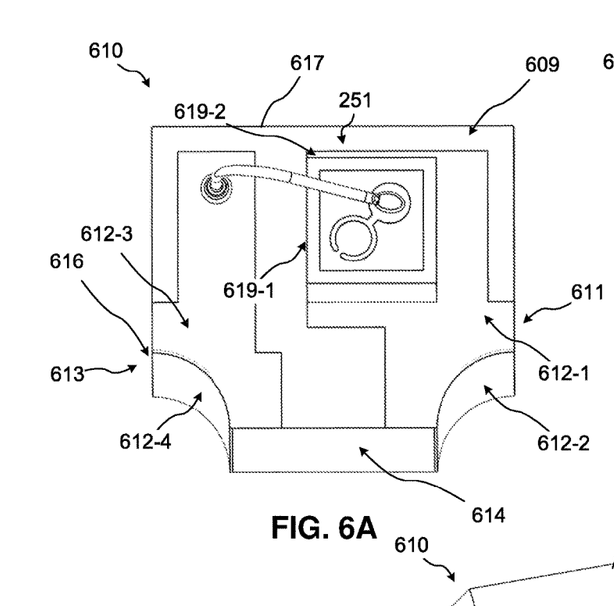
FIG. 6A shows a front view of a monitor photodiode submount suitable for use in the multi-channel optical transceiver module of FIG. 2, in accordance with an embodiment.
Figure 6B:
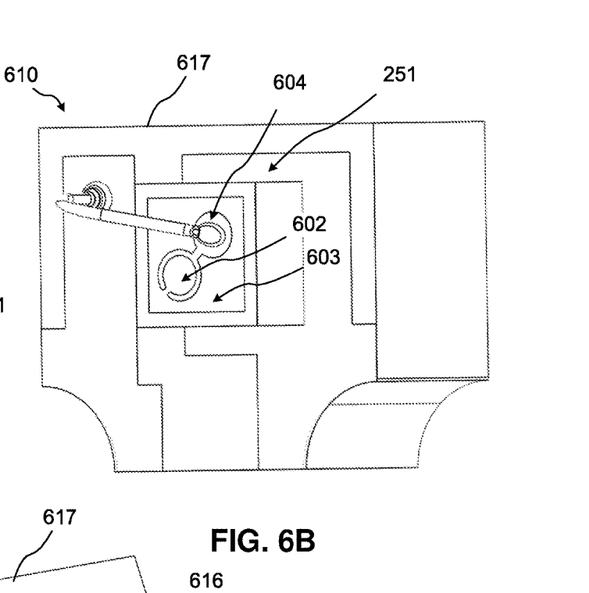
FIG. 6B shows a perspective view of the monitor photodiode submount of FIG. 6A in accordance with an embodiment.
Figure 6C:
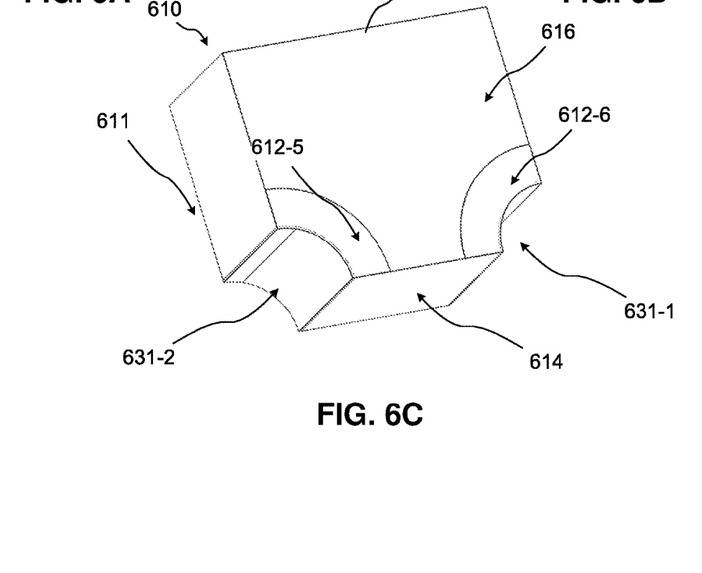
FIG. 6C shows another perspective view of a rear side of the monitor photodiode submount of FIG. 6A in accordance with an embodiment.

Referring to FIGS. 6A-6C, an example monitor photodiode submount 610 suitable for use with the MPD module 252 is shown in accordance with an embodiment. The monitor photodiode (MPD) submount 610 is configured to couple to and align a MPD 251 with an associated laser diode, as discussed above. The MPD submount 610 comprises a base 617 having a plurality of sidewalls to provide at least one mounting surface for supporting an MPD and supporting circuitry and at least one mating surface for coupling to an associated transceiver substrate. The base 617 can comprise, for instance, Silicon (Si), or any other non-conductive suitably rigid material. The base 617 may be formed monolithically from a single piece of material or from multiple pieces. While the following discussion includes reference to disposing/patterning metallic material on to a non-conductive base, e.g., formed from Si to provide electrically conductive paths, the base 617 may be at least partially formed from a conductive material such as a metal to provide integrated traces. In this instance, multiple independent electrical traces/paths may be provided by disposing an electrical insulating layer therebetween.

Continuing on, at least one sidewall defining the base 617 of the submount 610 provides a mounting surface 609 for coupling to and supporting MPD 251, such as shown. At least one sidewall defining the base 617 of the submount 610 further provides mating surface 614 for mounting to and being supported by TOSA connecting pads, as will be discussed in greater detail below. As shown, the mounting surface 609 extends substantially transverse relative to the mating surface 614 to provide a vertical mounting orientation for the MPD 251.

The base 617 further provides at least first and second electrically conductive paths 611, 613 disposed along multiple sidewalls of the base 617 using a plurality of conductive traces disposed/patterned thereon. In particular, the first electrically conductive path 611 is collectively provided by at least first and second conductive traces 612-1, 612-2 (or conductive segments) disposed on the base 617. Likewise, the second electrically conductive path 613 is collectively provided by at least third and fourth conductive traces 612-3 and 612-4 (or conductive segments) disposed on the base 617. Patterning of the conductive traces 612-1 to 612-4 can comprise deposition of one or more layers of metallic material such as copper, silver, or other suitable material on to sidewalls of the base 617.

At least a portion of the first conductive trace 612-1 defines the mounting surface 609 for both physically and electrically coupling to the MPD 251. Further, the first conductive trace 612-1 includes a region with a relatively rectangular profile having a width that is about 1.2× to 1.3× the width of the MPD 251. This rectangular profile may be dimensioned such that corner(s) of the same get disposed at substantially a center of the mounting surface 609. Alignment of the MPD 251 relative to the base 617, and more importantly relative to an associated laser diode, may therefore be initially accomplished along the X, Y and Z axis by ensuring that the edges 619-1 and 619-2 of MPD 251 mount substantially flush with a far edge of rectangular pad provided by the first conductive trace 612-1. Stated differently, alignment of MPD 251 can include mounting the same at a predetermined position on the first conductive trace 612-1 such that edges 619-1 and 612-2 extend parallel with the edges defining the rectangular pad and include a relatively uniform gap therebetween measuring about 0 to 100 microns. The first conductive trace 612-1 may therefore provide a visual alignment indicator, e.g., in the form of a rectangular pad or other regular or non-regular geometric shape, to provide a visual representation of a predefined mounting location for the MPD to simplify mounting and alignment of the same.

The above-discussed mounting and alignment of MPD 251 on to the MPD submount 610 can occur prior to attachment to the transceiver substrate 202 (FIG. 2). The MPD submount 610 may therefore get mounted to the transceiver substrate 202 with the MPD 251 being aligned along at least the X and Z axis with the associated laser diode. Alignment along the Y axis can include simply shifting the MPD submount 610 laterally until nominal optical coupling with an associated laser diode gets achieved.

Continuing on, the first conductive trace 612-1 extends towards the transceiver substrate 202 when the MPD submount is coupled thereto. The first conductive trace 612-1 also extends substantially transverse relative to the first mounting surface 245 of substrate 202 when coupled thereto (See FIG. 3). The first conductive trace 612-1 then transitions to the second conductive trace 612-2 based on an edge/intersection between associated sidewalls of the base 617. The second conductive trace 612-2 extends substantially transverse relative to the mounting surface 609, and substantially parallel relative to the first mounting surface 245 of the transceiver substrate 202 when coupled thereto (See e.g., FIGS. 3-5).

As further shown, third and fourth conductive traces 612-3 and 612-4 are disposed on the base 617 to collectively define a second electrically conductive path to electrically couple the MPD 251 to the transceiver substrate 202. The third conductive trace 612-3 is disposed on the mounting surface 609 and is configured to electrically couple to the MPD 251 via, for instance, wire bonding such as shown. The third conductive trace 612-3 extends towards the transceiver substrate 202 when the MPD submount 610 is coupled thereto. The third conductive trace 612-3 transitions to the fourth conductive trace 612-4 at an edge/intersection between sidewalls of the base 617. The fourth conductive trace 612-4 extends substantially transverse relative to the mounting surface 609 and substantially parallel relative to the first mounting surface 245 of the transceiver substrate 202.

The first and second conductive paths 611, 613 therefore include at least one region/segment that extend substantially in parallel, and proximate, to an interface formed between the mating surface 614 and the first mounting surface 245 of the transceiver substrate 202 when the MPD submount 610 is coupled thereto. As discussed in greater detail below, the first and second conductive paths 611, 613 can be electrically coupled to the transceiver substrate 202 utilizing a conductive epoxy or other conductive material that can be disposed around MPD submount 610.

The MPD 251 can comprise a surface MPD having a detecting surface/region 603 having a receiving area 602 that is configured to be optically coupled with an associated laser diode by being aligned along the X, Y and Z axis. In particular, alignment includes the receiving area being disposed at a position that intersects with an optical path extending from a back surface of the associated laser diode towards the MPD. An anode 604 is disposed on the detecting surface 603. A cathode (not shown) of the MPD 251 is provided on a surface opposite the detecting surface 603. The MPD 251 mounts (e.g., directly) on the first conductive trace 612-1, with the associated cathode electrically connected to the first conductive path 611. The anode 604 electrically couples to the second conductive path 613 by wire bonding, for instance.

As shown in FIGS. 6A-6C, the body 617 of the MPD submount 610 can include channels/notches 631-1, 631-2. The channels 631-1, 631-2 extend substantially transverse relative to mounting surface 609 and include a curved/arcuate profile (such as shown). Other shapes and configurations for the channels 631-1, 631-2 are within the scope of this disclosure. As further shown, the second conductive trace 612-2 and the fourth conductive trace 612-4 are at least partially disposed on the channels 631-1, 631-2. The channels 631-1, 631-2 can advantageously facilitate flow and adhesion of a layer of epoxy 509 (FIG. 5) to securely attach the MPD submount 610 to an associated transceiver substrate, e.g., transceiver substrate 202. In addition, the channels 631-1, 631-2 reduce the overall footprint of the mating surface 614 by providing a taper, and by extension, reducing the overall footprint of the MPD submount 610 when coupled to the transceiver substrate 202 (See FIG. 5). The channels 631-1, 631-2, may thus define a tapered region that at least partially defines the mating surface 614.

When the MPD submount 610 mounts to the transceiver substrate 202 via mating surface 614, conductive epoxy 509 can flow into the channels 631-1, 631-2 to securely attached the MPD submount 610 at a predetermined position, as discussed further below. The rounded profile/shape of the channels 631-1, 631-2 can encourage increased adhesion and allow for a relatively larger amount of conductive epoxy to be utilized and substantially confined without the same inadvertently contacting adjacent conductive pads/traces. Note that while the embodiment of FIGS. 6A-6C show two channels 631-1, 631-2, this disclosure is not limited in this regard. An MPD submount consistent with the present disclosure can have a single channel, or a plurality of channels (as shown), or no channels depending on a desired configuration.

As shown in FIG. 6C, the first and second conductive paths 611, 613 can also include fifth and sixth conductive traces 612-5, 612-6, respectively. The fifth and sixth conductive traces 612-5, 612-6 can be disposed on back surface 616, with back surface 616 being disposed opposite the mounting surface 609. In this embodiment, the fifth and sixth conductive traces 612-5, 612-6 can further increase electrical conductivity via the conductive epoxy and can balance bonding stresses applied to the MPD submount 610.

Referring back to FIGS. 3-5, with additional reference to FIGS. 6A-6C, the MPD submount 610 is shown implemented as MPD module 252. These MPD module 252 is configured to be disposed on the TOSA connector pads 423, 424, and when coupled thereto, an interface 504 gets formed between the MPD module 252 and the surfaces defining the transceiver substrate 202 (See FIG. 5). A layer of conductive epoxy 509, e.g., silver epoxy, may be disposed along the interface 504 between MPD module 252 and surfaces defining the transceiver substrate 202, and in particular, the connector pads 423, 424.

Therefore, the first and the second conductive paths 611, 613 (FIG. 6A) electrically couple to a pad/trace of the transceiver substrate based at least in part on the layer of conductive epoxy 509. Minor adjustment to MPD orientation along the Y axis, e.g., relative to an associated laser diode, can be achieved while the layer of conductive epoxy 509 cures, thus allowing for greater tolerances and multiple manufacturing phases to occur at potentially the same time. To avoid or otherwise reduce reflection losses, the receiving area 602 may be disposed at an angle with respect to the light path of the laser diode. The angle may be, for example, 0-15°, and preferably about 8° relative to normal.

In accordance with an aspect of the present disclosure a monitor photodiode (MPD) submount for coupling to and aligning a MPD with an associated laser diode in an optical transceiver or transmitter module is disclosed. The MPD submount comprising a base formed by a plurality of sidewalls, wherein at least one sidewall of the plurality of sidewalls provides a mounting surface for coupling to the MPD, and at least one sidewall provides a mating surface for coupling to a mounting surface of a substrate, the mounting surface of the base extending substantially transverse relative to the mating surface, at least first and second conductive traces disposed on the base that collectively define a first conductive path, and wherein the first conductive trace is disposed on the mounting surface of the base and is configured to electrically couple to the MPD, and wherein the first conductive trace extends towards the mounting surface of the substrate when the MPD submount is coupled thereto, and the first conductive trace transitions to the second conductive trace, and wherein the second conductive trace extends substantially transverse relative to the mounting surface of the base and substantially parallel relative to the mounting surface of the substrate.

In accordance with another aspect of the present disclosure a multi-channel optical transceiver is disclosed. The multi-channel optical transceiver comprising a transceiver substrate that extends from a first end to a second end, the transceiver substrate including at least a first mounting surface having a plurality of transmitter optical subassembly (TOSA) connector pads disposed proximate the first end for electrically coupling with a TOSA arrangement, a TOSA arrangement for outputting a plurality of channel wavelengths, the TOSA arrangement being coupled to the first end of the transceiver substrate, a plurality of MPD modules disposed on the first mounting surface of the transceiver substrate to monitor optical power of the TOSA arrangement, each of the plurality of MPD modules comprising a base formed by a plurality of sidewalls, wherein at least one sidewall of the plurality of sidewalls provides a mounting surface coupled to couple to an MPD, and at least one sidewall provides a mating surface coupled to the first mounting surface of the transceiver substrate, at least first and second conductive traces disposed on the base that collectively define a first conductive path, and wherein the first conductive trace is disposed on the mounting surface of the base and is configured to electrically couple to the MPD, and wherein the first conductive trace extends towards the mounting surface of the substrate, and the first conductive trace transitions to the second conductive trace, the second conductive trace extending substantially transverse relative to the mounting surface of the base and substantially parallel relative to the mounting surface of the substrate.

While the principles of the disclosure have been described herein, it is to be understood by those skilled in the art that this description is made only by way of example and not as a limitation as to the scope of the disclosure. Other embodiments are contemplated within the scope of the present disclosure in addition to the exemplary embodiments shown and described herein. Modifications and substitutions by one of ordinary skill in the art are considered to be within the scope of the present disclosure, which is not to be limited except by the following claims.

What is claimed is:

1. A monitor photodiode (MPD) submount for coupling to and aligning a MPD with an associated laser diode in an optical transceiver or transmitter module, the MPD submount comprising:
a base formed by a plurality of sidewalls, wherein at least one sidewall of the plurality of sidewalls provides a mounting surface for coupling to the MPD, and at least one sidewall provides a mating surface for coupling to a mounting surface of a substrate, the mounting surface of the base extending substantially transverse relative to the mating surface;
at least first and second conductive traces disposed on the base that collectively define a first conductive path, and third and fourth conductive traces disposed on the base that collectively define a second conductive path; and
wherein the first conductive trace is disposed on the mounting surface of the base and is configured to electrically couple to the MPD, and wherein the first conductive trace extends towards the mounting surface of the substrate when the MPD submount is coupled thereto, and the first conductive trace transitions to the second conductive trace, and wherein the second conductive trace extends substantially transverse relative to the mounting surface of the base and substantially parallel relative to the mounting surface of the substrate.

2. The MPD submount of claim 1, wherein the second conductive trace extends along a curved channel defined by the sidewalls of the base.

3. The MPD submount of claim 1, wherein the third conductive trace is disposed on the mounting surface of the base, and the fourth conductive trace is disposed on a sidewall of the base that extends substantially transverse relative to the mounting surface of the base.

4. The MPD submount of claim 1, wherein the first conductive trace provides a visual alignment indicator, the visual alignment indicator to provide a visual representation of a predefined mounting location for the MPD.

5. The MPD submount of claim 1, further comprising the MPD mounted to the mounting surface of the base, the MPD comprising a surface MPD.

6. The MPD submount of claim 5, wherein the MPD includes a detecting surface disposed opposite a surface having a cathode of the MPD, and wherein the surface having the cathode mounts to and electrically couples with the first conductive trace.

7. The MPD submount of claim 1, wherein the base includes a plurality of channels that define a tapered region, wherein the tapered region at least partially defines the mating surface of the base.

8. The MPD submount of claim 7, wherein the plurality of channels include an arcuate shape.

9. A multi-channel optical transceiver, the multi-channel optical transceiver comprising:
a transceiver substrate that extends from a first end to a second end, the transceiver substrate including at least a first mounting surface having a plurality of transmitter optical subassembly (TOSA) connector pads disposed proximate the first end for electrically coupling with a TOSA arrangement;
a TOSA arrangement for outputting a plurality of channel wavelengths, the TOSA arrangement being coupled to the first end of the transceiver substrate;
a plurality of MPD modules disposed on the first mounting surface of the transceiver substrate to monitor optical power of the TOSA arrangement, each of the plurality of MPD modules comprising:
a base formed by a plurality of sidewalls, wherein at least one sidewall of the plurality of sidewalls provides a mounting surface coupled to couple to an MPD, and at least one sidewall provides a mating surface coupled to the first mounting surface of the transceiver substrate;
at least first and second conductive traces disposed on the base that collectively define a first conductive path, and third and fourth conductive traces disposed on the base that collectively define a second conductive path; and
wherein the first conductive trace is disposed on the mounting surface of the base and is configured to electrically couple to the MPD, and wherein the first conductive trace extends towards the mounting surface of the substrate, and the first conductive trace transitions to the second conductive trace, the second conductive trace extending substantially transverse relative to the mounting surface of the base and substantially parallel relative to the mounting surface of the substrate.

10. The multi-channel optical transceiver of claim 9, wherein each MPD module of the plurality of MPD modules are disposed on the TOSA connector pads.

11. The multi-channel optical transceiver of claim 10, further comprising at least one layer of conductive epoxy disposed on an interface formed between each MPD module and associated TOSA connector pads to electrically couple each MPD module to the transceiver substrate.

12. The multi-channel optical transceiver of claim 10, wherein each MPD module includes a tapered region defined by the base, the tapered region providing the mating surface of the base.

13. The multi-channel optical transceiver of claim 12, wherein the tapered region is defined at least in part by a channel proximate the mating surface of the base.

14. The multi-channel optical transceiver of claim 13, wherein the channel includes an arcuate shape.

15. The multi-channel optical transceiver of claim 13, wherein at least one layer of conductive epoxy is disposed within the channel of each MPD module to electrically couple and securely attach each MPD to the transceiver substrate.

16. The multi-channel optical transceiver of claim 10, wherein each MPD module includes an anode and cathode of an associated MPD electrically coupled to the transceiver substrate via a layer of conductive epoxy, respectively.

* * * * *